United States Patent [19]
Hillman

[11] Patent Number: 6,059,888
[45] Date of Patent: May 9, 2000

[54] WAFER CLEANING SYSTEM

[75] Inventor: Gary Hillman, Livingston, N.J.

[73] Assignee: Creative Design Corporation, Montville, N.J.

[21] Appl. No.: 09/191,691

[22] Filed: Nov. 13, 1998

Related U.S. Application Data

[60] Provisional application No. 60/065,714, Nov. 14, 1997.

[51] Int. Cl.[7] .................................. B08B 7/00; A47L 1/02
[52] U.S. Cl. ...................................... 134/6; 15/77; 15/102
[58] Field of Search ............................. 15/77, 21.1, 88.2, 15/88.3, 88.4, 97.1, 102; 134/153, 902, 6

[56] References Cited

U.S. PATENT DOCUMENTS

| | | | |
|---|---|---|---|
| 3,261,286 | 7/1966 | Hunter et al. | 15/88.3 |
| 5,675,856 | 10/1997 | Itzkowitz | 15/77 |
| 5,860,181 | 1/1999 | Maekawa et al. | 15/88.3 |
| 5,862,560 | 1/1999 | Jensen et al. | 15/88.3 |
| 5,868,857 | 2/1999 | Moinpour et al. | 15/102 |
| 5,966,765 | 10/1999 | Hamada et al. | 15/21.1 |
| 5,976,267 | 11/1999 | Culkins et al. | 15/77 |

FOREIGN PATENT DOCUMENTS

| | | |
|---|---|---|
| 712 | 7/1899 | Austria . |
| 674645 | 4/1939 | Germany . |

*Primary Examiner*—Terrence R. Till
*Assistant Examiner*—Andrew Aldag
*Attorney, Agent, or Firm*—Lerner, David, Littenberg, Krumholz & Mentlik, LLP

[57] ABSTRACT

A wafer scrubbing system includes a upper and lower elongated scrubbers extending generally parallel with one another, the scrubbers being driven in rotation about their own axes. The wafer is disposed between the scrubbers so that the top and bottom surfaces of the wafer engage the scrubbers. The scrubbers are arranged to provide different frictional forces with the wafer at opposite ends of the scrubbers, and thereby provide a torque on the wafer about a central axis transverse to the top and bottom surfaces of the wafer and transverse to the scrubber axes.

21 Claims, 6 Drawing Sheets

WAFER CLEANING SYSTEM

CROSS REFERENCE TO RELATED APPLICATION

The present application claims the benefit of U.S. Provisional Patent Application Ser. No. 60/065,714 filed on Nov. 14, 1997, the disclosure of which is hereby incorporated by reference herein.

FIELD OF THE INVENTION

The present invention is directed to a wafer cleaning system for cleaning semiconductor wafers.

BACKGROUND OF THE INVENTION

When dealing with wafers in the semi-conductor industry, it is important that the surfaces of the wafers be free from contamination. Wafer surfaces can be contaminated by various sources, including air-borne particulates, particles of semiconductor material removed during fabrication of the wafers or through the transportation or handling of the wafers. Such detritus may be found on either surface of the wafer. This detritus must be removed prior to using or further processing of the wafers to maintain the ultraclean conditions required for such uses.

U.S. Pat. No. 5,675,856 to Itzkowitz discloses a wafer scrubbing device which includes a pair of generally cylindrical brushes mounted on parallel shafts. In operation, each brush rotates around its own axis. The wafer is held between the brushes. A mechanism causes the brushes to extend back and forth radially across the surfaces of the wafer. At an extreme radial position, the cylindrical brushes engage only those portions of the wafer on one side of the center of the wafer. In this position, the rotating brushes apply a net torque around the center of the wafer, thereby imparting the wafer in rotation around its center. In another position, the brushes extend entirely across the wafer, so that the brushes apply no net torque on the wafer and the rotation of the wafer tends to stop. Thus, the radial movement of the brushes creates a speed differential between the constant rotational speed of the brushes and the variable rotational speed of the wafer.

However, such a mechanism is complex, costly and bulky. Thus, there is still a need for a wafer cleaning system which provides a simple and reliable means of subjecting all of the surfaces of the wafer to scrubbing.

The foregoing objects, features and various advantages of the present invention will be more readily apparent from the following detailed description of the preferred embodiments set forth below, taken in conjunction with the accompanying drawings.

SUMMARY OF THE INVENTION

One aspect of the present invention provides a double sided scrubber system for cleaning a wafer having a top surface and a bottom surface. The scrubber system includes a frame and a first scrubber set comprising an upper scrubber having an upper scrubber axis and a lower scrubber having a lower scrubber axis. The upper scrubber and lower scrubber each have first and second ends. The scrubbers are supported on the frame so that the scrubbers can be disposed in operative positions. When the scrubbers are in their operative positions, the scrubbers extend side by side, generally codirectionally with one another, so that the first ends of the scrubbers are disposed adjacent one another and so that the second ends of the scrubbers are also disposed adjacent one another. Desirably, the scrubbers in their operative positions engage the wafer on both sides of the central axis of the wafer. Most preferably, the scrubbers extend entirely across the top and bottom surfaces of the wafer.

The scrubbers are constructed and arranged so that when the scrubbers are in their operative positions and a wafer is disposed between the scrubbers, the scrubbers extend across the top and the bottom surfaces of the wafer, and engage the wafer with a first frictional force adjacent the first ends of the scrubbers and with a second frictional force different from the first frictional force adjacent the second ends of the scrubbers. A rotational drive is connected to the scrubbers to turn the scrubbers of the first set about their respective scrubber axes in opposite rotational directions, so that surfaces of the scrubbers adjacent one another move in the same linear direction. A constraint structure is disposed adjacent the scrubbers for retaining a wafer between the scrubbers. The constraint structure allows the wafer to rotate about its center while preventing translational movement of the wafer from between the scrubbers. When a wafer is engaged between the scrubbers, and the scrubbers rotate, different frictional forces are applied at different locations on the surface of the wafer. This applies a torque to the wafer about the central axis of the wafer, so that the wafer tends to rotate about its center. Rotational movement of the wafer brings various portions of the wafer into engagement with the scrubbers so that the entire wafer can be scrubbed. Thus, no additional mechanical complexity is required to turn the wafer during the scrubbing operation. The scrubbers can be driven at constant rotational speed during scrubbing and need not be accelerated and decelerated. The system will reliably scrub the entire surfaces of the wafers.

Preferably, the scrubber system includes upper and lower scrubber carriers mounted to the frame for movement between first positions and second positions. The upper scrubber of the first set is mounted to the upper scrubber carrier whereas the lower scrubber of the first set is mounted to the lower scrubber carrier. The scrubbers of the first set are in operative positions when the scrubber carriers are in the first position, but the scrubbers of the first set are out of operative positions when the scrubbers are in the second position. Most preferably, a second set of scrubbers is also mounted on the scrubber carriers. The second set of scrubbers includes an upper and lower scrubber constructed similarly to the scrubbers of the first set. The scrubbers of the second set are in operative positions when the scrubber carriers are in the second position. Most desirably, the scrubber carriers are mounted to the frame for rotational movement about upper and lower scrubber carrier axes, and the scrubber carrier axes are generally codirectional with the scrubber axes of the various scrubbers. As further described below, this arrangement provides a simple way of moving the scrubbers of the various sets into and out of engagement with the wafer. Most preferably, the apparatus includes means for applying liquid on the surfaces of the wafer, on the scrubbers or both. The liquid may be an aqueous solution such as ammonium hydroxide or other conventional cleaning agent. The liquid also helps to prevent damage to the wafer by the scrubbers.

The scrubbers may be arranged in various ways to provide different frictional forces with the wafers adjacent their first and second ends. For example, the scrubbers may be formed with different materials adjacent their first and second ends so as to provide different coefficients of friction. Also, the scrubbers may be tapered so that each scrubber is radially compressed a greater degree adjacent one end when a wafer is engaged with the scrubbers. In a further variant, the scrubber axis may be non-parallel, so that scrubber axes converge. Thus, greater forces will be applied between the scrubbers and the wafer adjacent one end, where the spacing between the scrubber axes is small than adjacent the opposite end, where the spacing between scrubber axes is large.

Further aspects of the present invention provide methods of cleaning. Methods according to this aspect of the invention include the steps of engaging upper and lower scrubbers with top and bottom surfaces of the wafers so that axes of the scrubbers extend across the top and bottom surfaces of the wafer and so that the first ends of the scrubbers are disposed on one side on the wafer center whereas the second ends of the scrubbers are disposed on the other side of the wafer center. The engaging step is performed so that the scrubbers engage the wafer with a first frictional force adjacent the first ends of the scrubbers and with a second frictional force different from the first frictional force adjacent the second ends of the scrubbers thereby providing a frictional force difference. The method according to this aspect of the invention also includes the step of driving the scrubbers in rotation about respective axes in opposite rotational directions. As discussed above in connection with the apparatus, the scrubbers impel the wafer in rotation about its central axis thereby bringing all portions of the wafer top and bottom surfaces into engagement with the scrubbers.

Further objects, features and advantages of the present invention will be more readily apparent from the detailed descriptions of the preferred embodiments set forth below, taken in conjunction with the accompanying drawings.

DETAILED DESCRIPTION OF PREFERRED EMBODIMENTS

Figure 1:
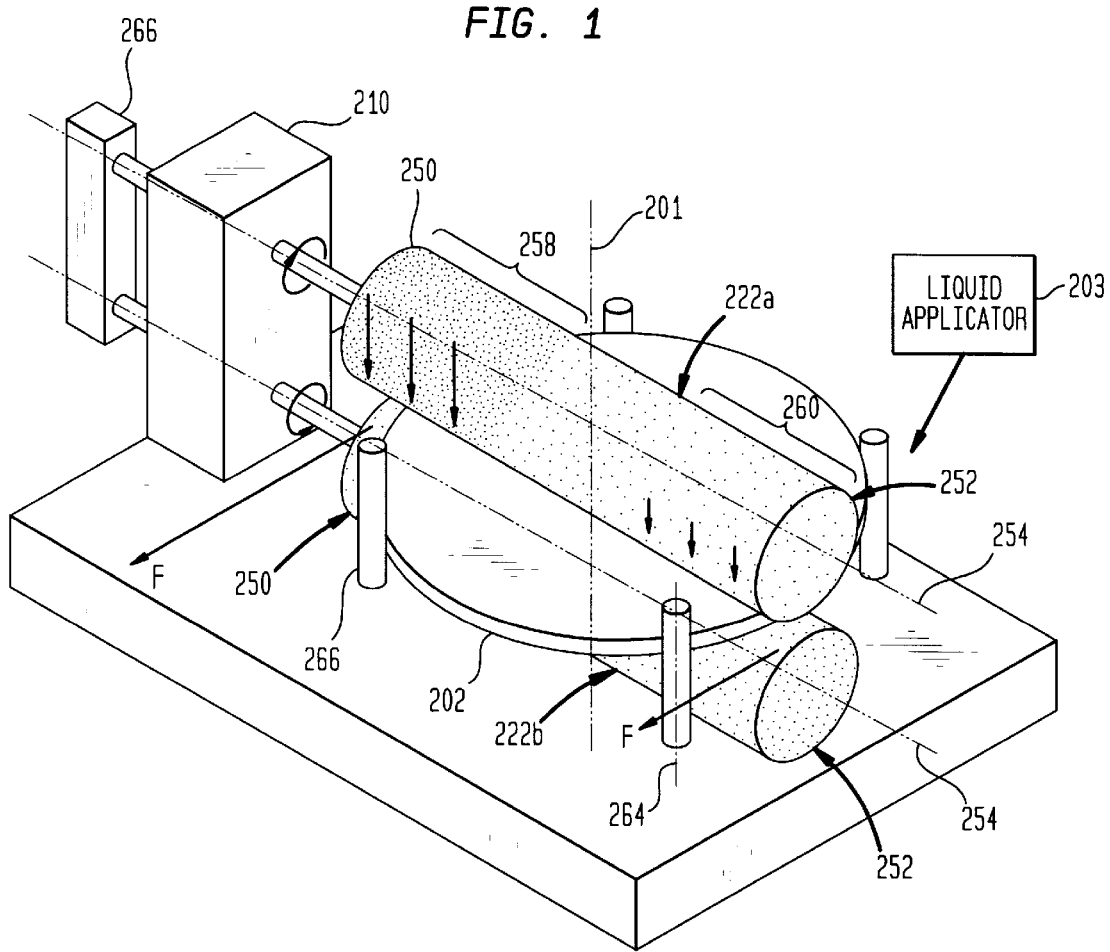
FIG. 1 is a diagrammatic perspective view of a scrubbing system according to one embodiment of the present invention.

Referring to FIG. 1, there is shown a simplified schematic drawing of the double sided scrubber system in accordance with one embodiment of the present invention. The double sided scrubber system includes a frame 210 and a set of two scrubbers 222a and 222b. Each scrubber 222 has a first end 250 and a second end 252 and has a scrubber axis 254. The scrubbers are mounted to frame 210 in an operative position, in which scrubber axes 254 extend parallel to one another, so that the first ends 250 of the scrubbers lie adjacent one another and the second ends 252 are adjacent one another. The scrubbers 222 are comprised of a plurality of bristles 256. The bristles 256 are relatively dense in a first region 258 adjacent the first end 250 of each scrubber and are relatively sparse in a second region 260 adjacent the second end 252 of each scrubbers. Thus, each of the scrubbers has a relatively large radial compressibility in region 260, adjacent its second end, and a relatively small radial compressibility in region 258, adjacent its first end.

The double sided scrubber in accordance with this embodiment also includes a rotational drive 262 connected to the scrubbers 222 and a plurality of constraints 264. The rotational drive may include a conventional motor or motors, together with conventional power transmission components for connecting the motor or motors to scrubbers 222. The constraints 264 have constraint axes 266 and are mounted to the frame 210. The constraints 264 are comprised of rollers and can rotate about their constraint axes 266. The apparatus further includes a liquid applicator 203 for applying a liquid such as water, an aqueous solution such as ammonioum hydroxide solution or an organic solvent onto the wafer, the scrubbers or both. Applicator 203 includes a source of the liquid to be applied, and may also include conventional devices such as nozzles, pumps and the like for applying a spray or flood of the liquid onto the wafer so as to provide liquid on the top and bottom surfaces of the wafer. The applicator may be arranged to recover and filter the liquid for reuse. Alternatively, the applicator may also be arranged to maintain a bath of liquid covering the scrubbers, and hence covering the wafer while the wafer is engaged between the scrubbers. In a further alternative, applicator 203 may be arranged to apply the liquid to the wafer before the wafer is engaged by the scrubbers.

In operation, a wafer 202 is introduced into the system so that the wafer is constrained by the constraints 264. The scrubbers 222 are engaged with the top surface 204 of the wafer and bottom surface 206 of the wafer respectively. A liquid is disposed on the top surface 204 and bottom surface 206 of the wafer 202 by applicator 203. The scrubbers 222 extend completely across the surfaces of the wafer so that the first ends 250 of the scrubbers 222 are disposed on one side of the center of the wafer whereas the second ends 252 of the scrubbers 222 are disposed on the other side of the center of the wafer.

As shown in FIG. 1, the scrubbers 222a and 222b are caused to rotate by the rotational drive 262 in opposite directions about their respective axes 254. The distance between each axis 254 and the wafer surfaces is less than the radius of each scrubber. Therefore, the portion of each scrubber engaged with the wafer is compressed radially. Because the bristles are relatively dense and the radial compressibility of the scrubbers is relatively low in the first regions 258, each scrubber exerts a first, relatively high pressure on the wafer surfaces adjacent the first ends 250 of the scrubbers 222. Because the bristles are relatively sparse and the radial compressibility of the scrubber is high in the second region 260, a lower second pressure is provided to the wafer surfaces adjacent the second ends 252 of the scrubbers 222. This difference in pressure creates differences in the frictional forces applied between the scrubbers 222 and the wafer 202. Adjacent the first ends 250 of the scrubbers 222 a relatively large frictional force F is applied to the wafer, while adjacent the second ends 252 of the scrubbers 222 a smaller frictional force f is applied to the wafer. The different frictional forces on opposite sides of the center of the wafer creates a torque on the wafer about the center which causes the wafer 202 to rotate more or less about a central axis 201 transverse to the top and bottom surfaces of the wafer and transverse to the scrubber axes. As the wafer rotates, the wafer is kept in position by the constraints 264. The constraints 264 allow rotational movement of the wafer but prevent translation of the wafer. The rotation of the wafer causes all of the top and bottom surfaces of the wafer to be scrubbed by the scrubbers 222. At the first ends 250 of the scrubbers, where the frictional force is relatively high, the difference in surface speeds between the scrubbers and the wafer will be relatively low. However, as the wafer rotates, that portion of the wafer which is initially disposed at the first ends of the scrubbers will be brought into engagement with the second ends of the scrubbers, where the difference in speeds is higher. Thus, effective scrubbing action will be provided at all portions of the wafer surfaces. Once the entire top and bottom surfaces have been scrubbed by the scrubbers 222, the wafer can then be removed from the system.

Figure 2:
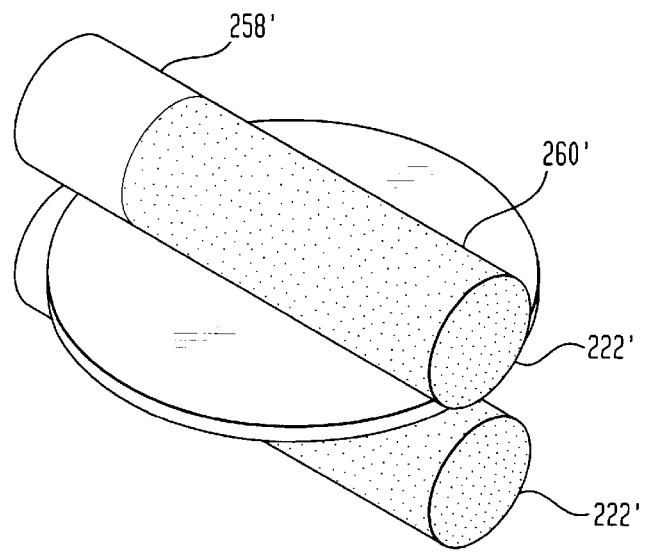
FIG. 2 is a view similar to FIG. 1 but depicting elements of a scrubbing system according to a further embodiment of the present invention.

Other scrubber structures which provide differences in frictional forces can be employed. For example, scrubbers 222' (FIG. 2) have a sponge like material 258' on the exterior of the scrubber in the first region, adjacent the first ends of the scrubbers. The sponge like material has a greater surface area than the bristles in the second region 260'. The sponge like material provides a surface with a different coefficient of friction than the surface provided by the bristles, and hence provides a difference in the frictional engagement forces exerted at the opposite ends of the scrubbers even if the forces exerted at the two ends of the scrubbers are the same.

Figure 3:
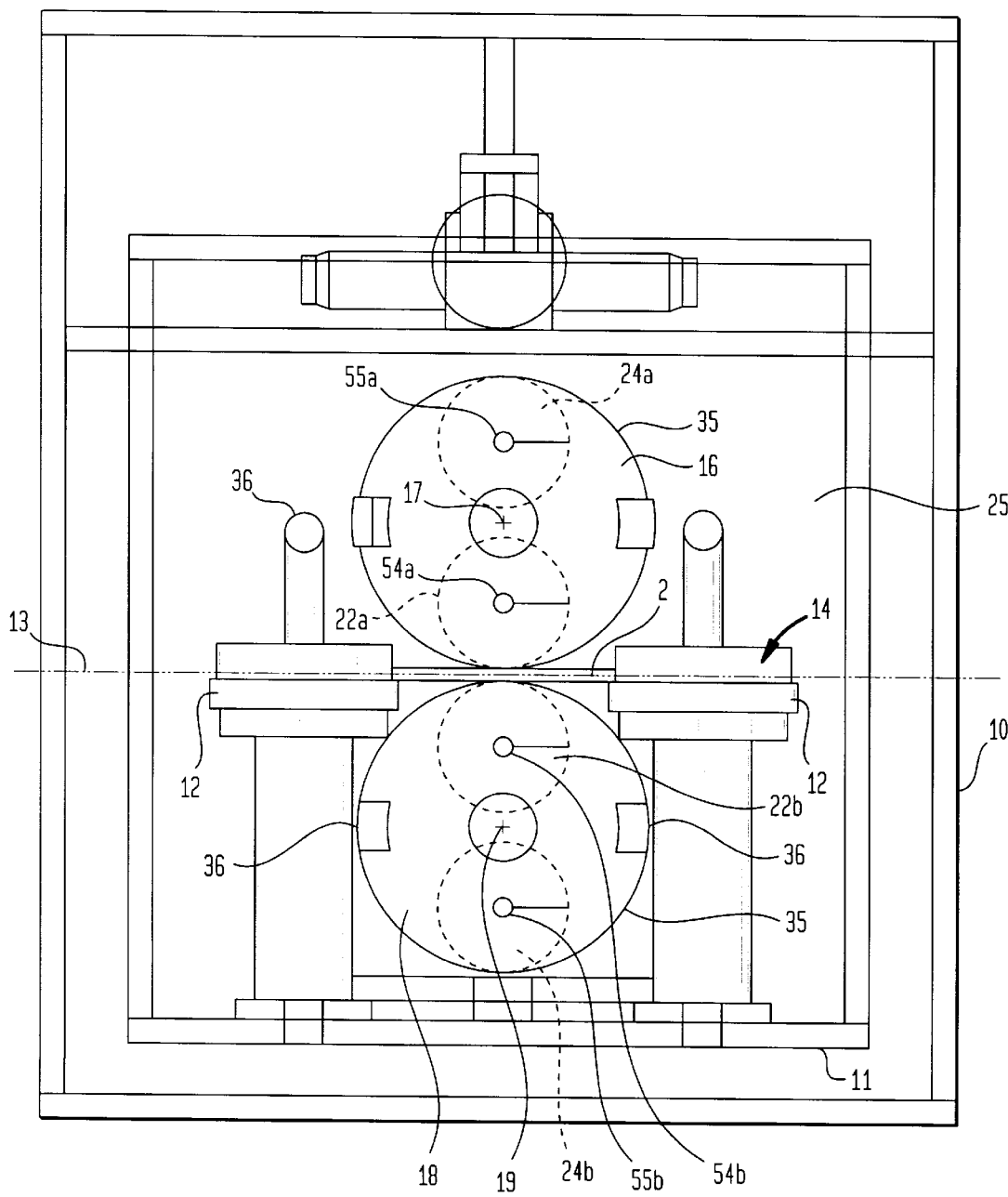
FIG. 3. is a front elevational view of a wafer cleaning system according to a further embodiment of the present invention.
Figure 4:
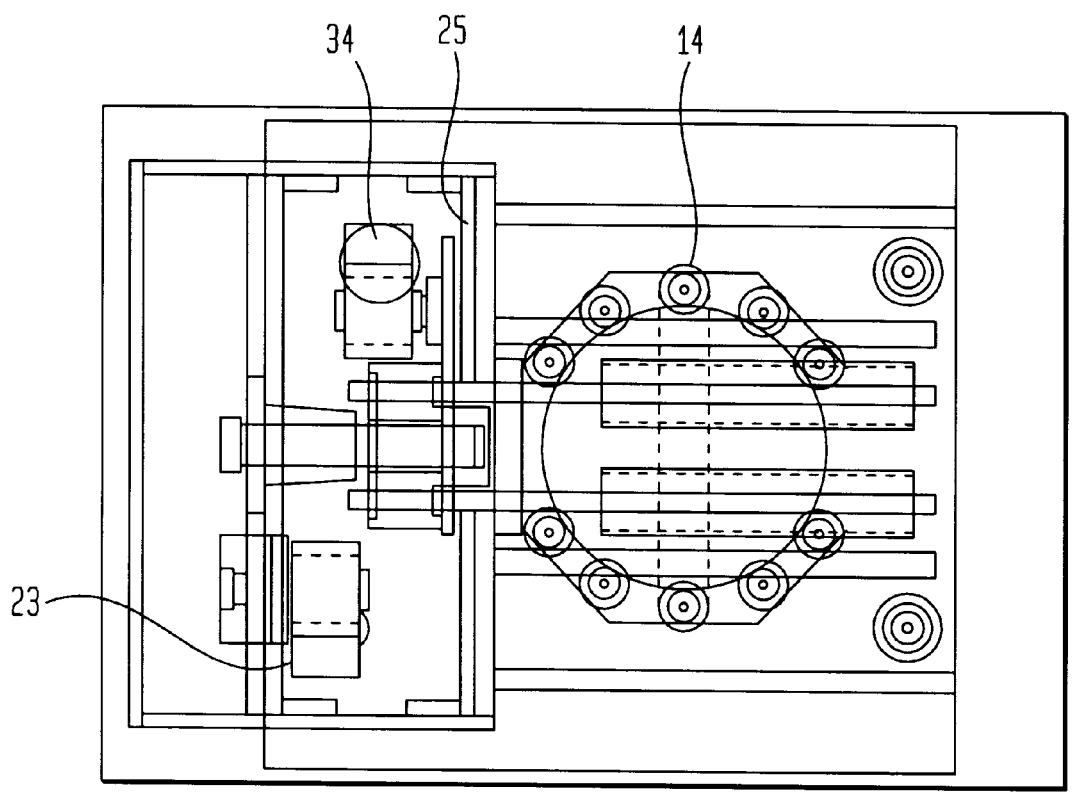
FIG. 4 is a top view of a wafer cleaning system shown in FIG. 3.

FIGS. 3 and 4 show the general layout of a double-sided wafer scrubber in accordance with a further embodiment of the present invention. The scrubber system includes a frame 10 and a temporary support yoke 11 with rollers 14 rotatably mounted thereon. The rollers 14 include flanges 12 which are located at a uniform elevation or plane 13. The scrubber system of this embodiment includes an upper scrubber carrier 16 mounted to frame 10 for rotation about an upper scrubber carrier axis 17 and a lower scrubber carrier 18 mounted to the frame for rotation about a lower scrubber carrier axis 19. The scrubber carriers are disposed above and below the selected elevation of the wafer. The terms above and below, for the purposes of this disclosure, should be understood in terms of the orientation of the system. Thus, although the system usually is operated in an upright orientation in which the up and down directions of the system correspond to the gravitational frame of reference, this is not essential.

A first scrubber set includes an upper scrubber 22a mounted to the upper scrubber carrier 16 for rotation about a scrubber axis 54a parallel or nearly parallel to the upper scrubber carrier axis 17. The first scrubber set also includes a lower scrubber 22b mounted to the lower scrubber carrier 18 for rotation about a scrubber axis 54b parallel or nearly parallel to the lower scrubber carrier axis 19. The second scrubber set includes an upper scrubber 24a mounted to the upper scrubber carrier 16 for rotation about a scrubber axis 55a parallel or nearly parallel to the upper scrubber carrier axis 17. The second scrubber set also includes a lower scrubber 24b mounted to the lower scrubber carrier 18 for rotation about a scrubber axis 55b parallel or nearly parallel to the lower scrubber carrier axis 19.

Figure 5:
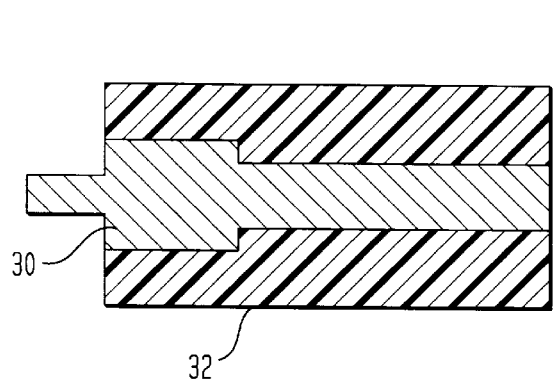
FIG. 5 is a sectional view of elements of the scrubbing system shown in FIG. 3.
Figure 6:
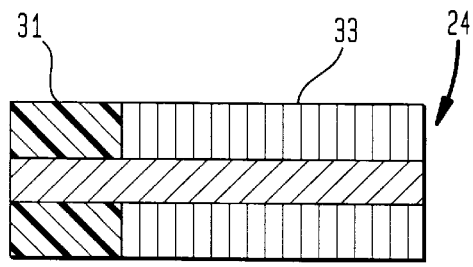
FIG. 6 is a sectional view of elements of the scrubbing system shown in FIG. 3.

The scrubbers 22 are comprised of a core and a conformable outer material. The conformable outer material can be a variety of substances including, but not limited to, a sponge like material or a layer of bristles in varying degrees of stiffness. In this embodiment, each scrubber 22 of the first scrubber set (FIG. 5) includes a sponge like material such as polyvinyl alcohol disposed on a core 30, the core having a larger diameter in a first region adjacent the first ends of the scrubbers and a smaller diameter in a second region adjacent the second ends of the scrubbers. Each scrubber 24 of the second set (FIG. 6) is comprised of a sponge like material 31 such as polyvinyl alcohol disposed on a core in a first region adjacent the first end of the scrubber and nylon bristles 33 disposed on the core in a second region adjacent the second end of the scrubber (FIG. 6). Bristles of the type referred to above are known in the art and are widely available. As in the embodiments discussed above with reference to FIGS. 1 and 2, the configuration of the scrubbers provides means for providing a differential in frictional forces between the ends of the scrubbers. The scrubbers 22 are elongated along the scrubber axes a distance at least equal to the diameter of the wafer.

The scrubber carriers 16 and 18 are connected to common moving means such as a mechanical scrubber carrier drive 23, or an electrical or pneumatic drive. (FIG. 4.) Scrubber carrier drive 23 is operative to rotate the scrubber carriers between the first position illustrated in FIG. 3 and a second position. In the first position of the scrubber carriers, the scrubbers 22a and 22b of the first set are disposed in operative positions, such that the scrubbers of the first set are disposed adjacent one another and extend side-by-side adjacent plane 13. In these operative positions of the first-set scrubbers, the first ends of the scrubbers 22a and 22b are aligned with one another and the second ends of the scrubbers are also with one another. The scrubber axes 54a and 54b of the first-set scrubbers extend parallel to one another. When the scrubber carriers are in their first positions, the scrubbers 24a and 24b of the second set are out of operative positions, and are remote from one another and remote from plane 13. When the scrubber carriers are in their second positions, the scrubbers 24a and 24b are in operative positions as discussed above with reference to the first set, whereas the first set of scrubbers are out of operative positions. The scrubber carrier drive 23 is also operative to hold the scrubber carriers at an idle position between the first and second positions. In the idle position, the scrubbers 22 of the first set and the scrubbers 24 of the second set are remote from plane 13.

The scrubbers 22 and 24 of the first and second sets are connected to a drive 34 (FIG. 4) which rotates the scrubbers 22 and 24 about their respective axes. The drive 34 mechanisms in this embodiment are conventional DC motors, AC motors, or other conventional drives. The drive mechanisms are isolated from the scrubbers by a partition wall 25 incorporated in the frame. Rotating seals such as O-rings or labyrinths 35 are provided where the scrubber carriers penetrate the partition wall 25. This protects the drives from the liquids applied to the wafers and protects the wafers from contaminants arising in the drives. Mounting of the scrubber carriers for rotation relative to the frame, rather than for translational movement or other, more complex movements, simplifies construction of the seals or labyrinths. A liquid applicator (not shown) similar to that discussed above with reference to FIG. 1 may be provided for applying liquids on the wet side of partition wall 25, in the area occupied by the scrubbers. Alternatively or additionally, a set of sponges 36 may be mounted to the frame at locations selected so that the scrubbers will contact the sponges while the scrubber carriers are in their idle positions. The sponges may be suffused with a liquid so that the liquid is applied to the scrubbers.

In operation of a double sided scrubber system of this embodiment, a wafer 2 is introduced into the scrubber system by wafer handling means while the scrubber carriers are in the idle position, with the scrubbers remote from plane 13. The wafer is placed on flanges 12 of rollers 14 to provide temporary support of the wafer 2 at or near a selected elevation, i.e., at or near plane 13. When the wafer 2 is positioned on the flanges 12 of the rollers 14, the wafer 2 will be above the lower scrubber carrier axis 19 and below the upper scrubber carrier axis 17.

Once the wafer 2 has been introduced into the double sided scrubber system, the scrubber carriers 16 and 18 are rotated to the first position by scrubber carrier drive 23, thereby bringing the scrubbers 22 of the first scrubber set into operative positions and into engagement with the wafer surfaces. When the first scrubber set rotates into engagement with the wafer surfaces, the wafer is lifted slightly off of the flanges 12 of the rollers 14, but is still kept within the boundary of the rollers 14. Thus, the rollers keep the wafer in place during the scrubbing process. Preferably, the flanges 12 are set approximately 0.40 inches below the centerline of the scrubber sets to ensure that the scrubbers in operative positions support the wafer and the rollers 14 only constrain the wafer 2 between the scrubbers while the scrubbers are in operative positions.

When the scrubbers 22 of the first scrubber are engaged with the wafer surfaces, they provide different frictional forces with the wafer on opposite sides of the wafer center in the same manner as discussed above with reference to FIGS. 1 and 2. The scrubbers of the first set are rotated about their respective scrubber axes, causing the wafer to rotate more or less about its center. This rotation allows the entire surfaces of the wafer to be scrubbed by the scrubbers 22 as discussed above.

After treatment by the scrubber 22 of the first set, the scrubber carriers are rotated to the second positions, and hence second scrubbers 24 are rotated into operative positions to scrub the surfaces of the wafer. The scrubbing operation is repeated using the second scrubbers 24. After the second scrubbing operation, the scrubber carriers are again rotated to their idle positions, thereby disengaging the wafer from the scrubbers and the wafer 2 is then unloaded by the wafer handling means. During the period of time between the cessation of scrubbing and the unloading of the wafer by the wafer handling means, the system may be kept moist by a continual spray of water.

Figure 7:
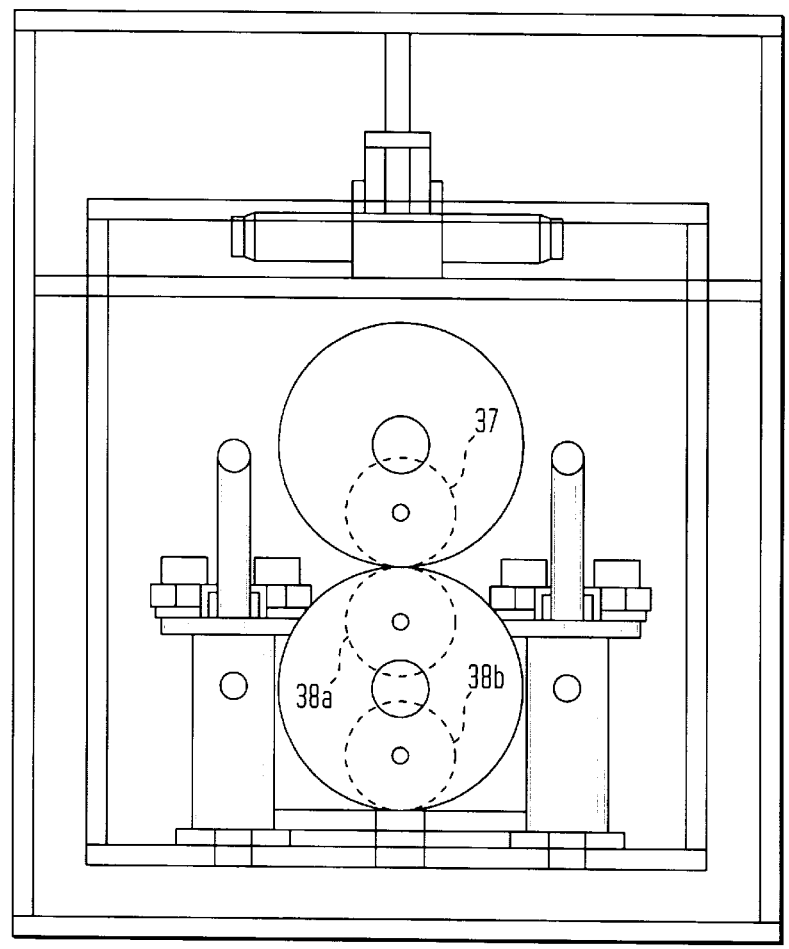
FIG. 7 is a front elevational view of a wafer cleaning system according to a further embodiment of the present invention.

FIG. 7 shows a further embodiment of the present invention. This embodiment is identical to the embodiment of FIGS. 3–6 except that in this embodiment one scrubber carrier carries more scrubbers than the other scrubber carrier. Thus, upper scrubber 37 forms a part of two scrubber sets incorporating two different lower scrubbers 38a and 38b. The opposite arrangement, with two upper scrubbers and one lower scrubber can be used. More than two sets of scrubbers can be provided. Also, the embodiment of FIGS. 3–6 can be made with only one scrubber set. Movement of the scrubber carriers brings the scrubbers into and out of operative positions.

Figure 8:
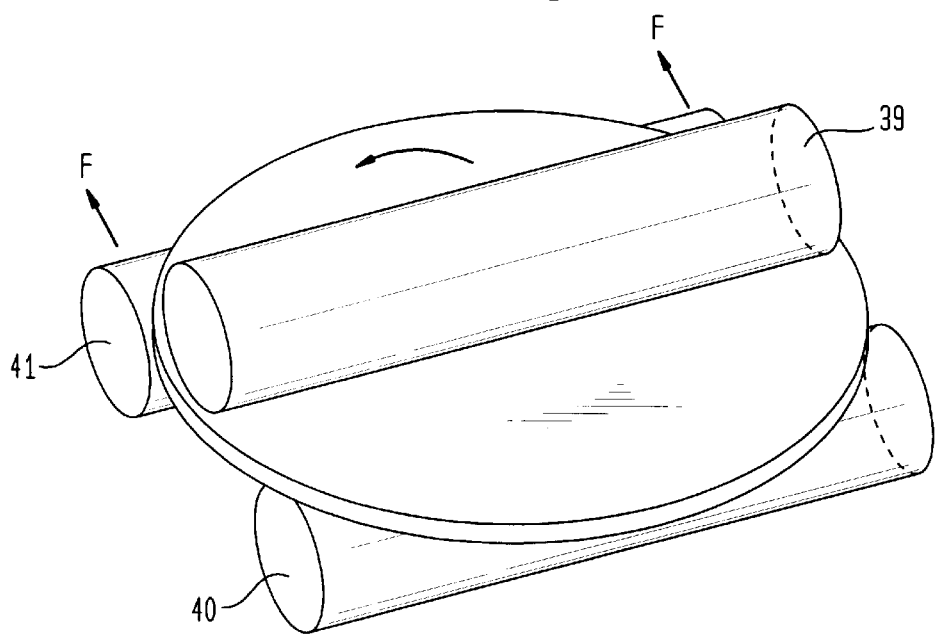
FIG. 8 is a diagrammatic elevational view of a further embodiment of the present invention.

FIG. 8 is a simplified schematic drawing of yet another embodiment of the present invention. This embodiment is similar to the embodiment of FIG. 1 except that the system of FIG. 8 includes multiple lower scrubbers 40 and 41 scrubbing a surface of the wafer simultaneously, with one upper scrubber 39. Here again, however, the upper scrubber 39 extends generally side by side with each of the lower scrubbers 40 and 41. The opposite arrangement (one lower scrubber with plural upper scrubbers) can be used. Also, plural upper scrubbers may operate simultaneously with plural lower scrubbers. In this embodiment as well, different frictional forces applied at opposite ends of the scrubbers create a torque on the wafer about the axis of the wafer.

Figure 9:
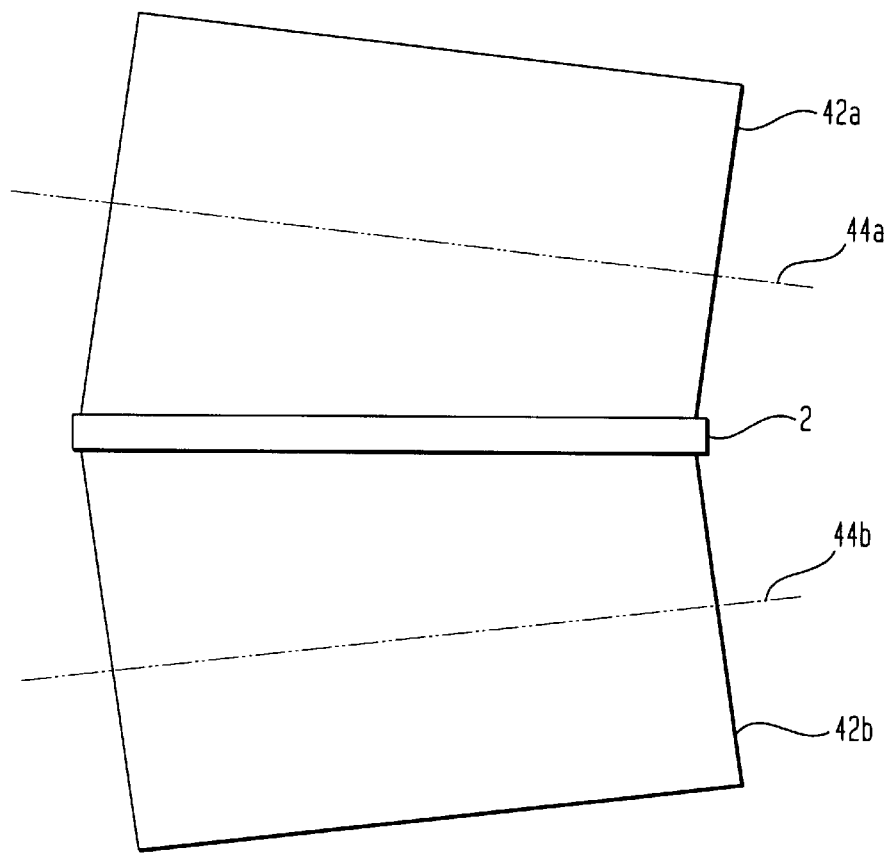
FIG. 9 is a diagrammatic elevational view depicting elements of a scrubbing system according to a further embodiment of the present invention.

In a further variant, schematically depicted in FIG. 9, the axes 44a and 44b of scrubbers 42a and 42b in their operative positions are not parallel, but instead converge slightly toward the second ends of the rollers. The rollers are uniform cylindrical bodies of constant properties over their entire lengths. However, because the axes of the rollers are closer to one another adjacent the second ends of the rollers, the rollers will be compressed to a greater degree adjacent the second ends, and accordingly will exert larger frictional forces on the wafer adjacent the second ends than adjacent the first ends. Here again, the difference in frictional forces causes rotation of the wafer. It should be appreciated that the degree of convergence is exaggerated in FIG. 9 for clarity of illustration. Most preferably, where the scrubber axes are non-parallel, they converge at an angle of less than about 15°, more preferably about 10° or less and most typically about 5°–10°. Thus, even though the axes are not parallel, the axes and the scrubbers are still generally codirectional. Where the scrubbers are mounted on rotatable scrubber carriers as discussed above with reference to FIGS. 3–6, the converging axes can be provided by tilting the axes of rotation of the scrubber carriers with respect to one another, or by tilting the scrubber axes with respect to the axes of rotation of the scrubber carriers.

Figure 10:
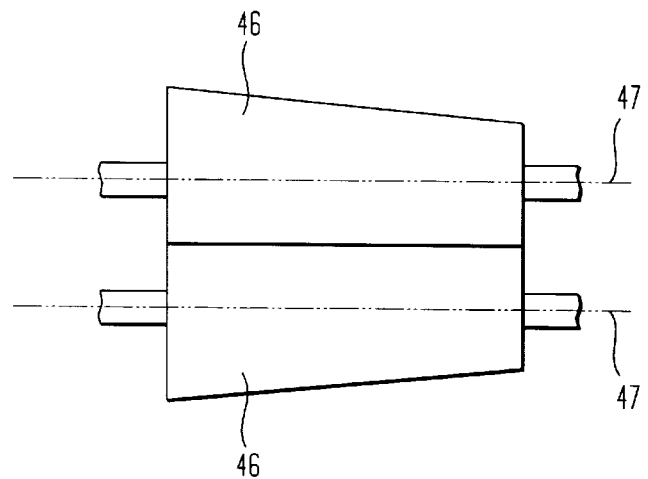
FIG. 10 is a diagrammatic elevational view depicting elements of a scrubbing system according to a further embodiment of the present invention.

The same effect can be obtained by mounting the scrubbers 46 (FIG. 10) on parallel axes 47 but tapering each scrubber 46 so that each scrubber, in its uncompressed condition, has a larger diameter adjacent one end than adjacent the other end. Here again, differences in the degree of compression of the scrubber will cause differences in frictional forces at the ends of the scrubbers.

Figure 11:
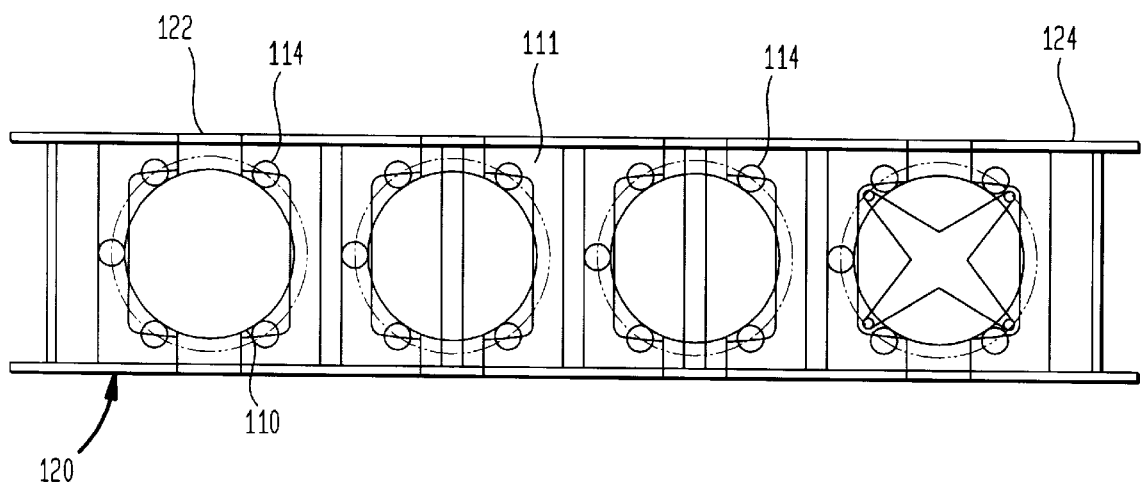
FIG. 11 is a top view of a temporary support device in accordance with the embodiment shown in FIG. 3.

In the embodiment discussed above with reference to FIGS. 3–6, the constraint system or temporary support device is fixed to the frame 10 of the double-sided scrubber system. As shown in FIG. 11, however, a series of movable support devices may be provided. Each movable support device 110 includes a yoke 111 and rollers 114 similar to the temporary support structures or constraints 14 discussed above. In operation, a support structure 110 is disposed on an indexing conveyor such as the chain conveyor 120 at an upstream end 122 of the conveyor 120. A wafer is loaded onto the support structure 110 before or after the support structure 110 is placed on the conveyor 120. As the conveyor 120 indexes, it moves the support structure 110 downstream to the next station. In this manner, the movable support device allows the wafer to proceed to a series of distinct stations without being handled between cleanings. When each support structure 110 reaches the scrubbing system, it is removed from the conveyor and positioned on the frame of the scrubbing system. At the scrubbing system, the wafer carried by the support structure is engaged and cleaned by scrubbers in the manner discussed above. The rollers 114 constrain the wafer in the same way as the constraints or rollers 14 discussed above with reference to FIGS. 3–6. However, there is no need to grasp the wafer itself and risk further contamination of the wafer while placing the wafer into the scrubbing system or removing it from the scrubbing system. After a few indexing cycles, the movable support device reaches the downstream end 124 of the conveyor 120, whereupon the wafer is removed. An additional movable support device, with a new wafer, is introduced to the upstream end 122 in each indexing cycle. In a variant of this system, the elements of the scrubbing station can be distributed at a plurality of stations. For example, a first set of scrubbers may engage the wafer at one station and a second set of scrubbers may engage the wafer at another station.

Numerous variations and combinations of the features discussed above can be used without departing from the invention. For example, at least one of the scrubbers may be helically shaped to pump water from the surface of the wafer. Also, while materials and scrubber configurations are referred to above in connection with each scrubber of the set, the same can be applied to individual scrubbers, i.e. to at least one scrubber. For example, in the embodiments discussed above with reference to FIGS. 2, 5 and 6, each scrubber has one radial compressibility or material at its first end and a different radial compressibility or different material at its second end, and such difference in compressibility and/or difference in material is provided in both scrubbers of the set. However, it is not essential to provide such a difference in both scrubbers of a set. Where such a difference is used, it is sufficient if at least one of the scrubbers in a set is provided with such a difference.

As these and other variations and combinations of the features discussed above can be used without departing from the invention as defined by the claims, the foregoing description of the preferred embodiments should be taken by way of illustration rather than by way of limitation of the invention defined by the claims.

What is claimed is:

1. A double sided scrubber system for cleaning a wafer having a top surface and a bottom surface, the scrubber system comprising:
   a) a frame;
   b) a first scrubber set comprising an upper scrubber having an upper scrubber axis and a lower scrubber having a lower scrubber axis, said upper scrubber and said lower scrubber each having a first end and a second end, said scrubbers being supported on said frame so that said scrubbers can be disposed in operative positions, said scrubbers in said operative positions extending generally codirectionally with one another with the first ends of said scrubbers disposed adjacent one another and with the second ends of said scrubbers disposed adjacent one another, said scrubbers being constructed and arranged so that when said scrubbers are in said operative positions and a wafer is disposed between said scrubbers, said scrubbers extend across the top and bottom surfaces of the wafer and engage the wafer with a first frictional force adjacent the first ends of the scrubbers and with a second frictional force different from said first frictional force adjacent the second ends of the scrubbers to thereby provide a frictional force difference;
   c) a rotational drive connected to said scrubbers of said first set operative to turn said scrubbers of said first set around said scrubber axes in opposite directions about their respective scrubber axes; and
   d) a constraint structure disposed adjacent said scrubbers for retaining the wafer between the scrubbers, said constraint structure allowing the wafer to rotate while preventing translational movement of the wafer from between the scrubbers.

2. The double sided scrubber system of claim 1 further comprising an upper scrubber carrier and a lower scrubber carrier, each one of said scrubber carriers being mounted to said frame for movement between a first position and a second position, said upper scrubber of said first set being mounted to said upper scrubber carrier, said lower scrubber of said first set being mounted to said lower scrubber carrier, said scrubbers of said first set being in said operative positions when said scrubber carriers are in said first positions.

3. The double sided scrubber system of claim 2 wherein said upper scrubber carrier is mounted to said frame for rotational movement about an upper scrubber carrier axis and said lower scrubber carrier is mounted to said frame for rotational movement about a lower scrubber carrier axis.

4. The double side scrubber system of claim 3 wherein said scrubber carrier axes are generally codirectional with said scrubber axes of said first set of scrubbers.

5. The double sided scrubber system of claim 4 further comprising a second set of scrubbers mounted on said scrubber carriers, said second scrubber set comprising an upper scrubber having an upper scrubber axis and a lower scrubber having a lower scrubber axis, said upper scrubber of said second set being mounted to said upper scrubber carrier, said lower scrubber of said second set being mounted to said lower scrubber carrier, said scrubber axes of said second set being generally codirectional with said scrubber carrier axes, said scrubbers of said second set being in said operative positions when said scrubber carriers are in said second positions.

6. The double sided scrubber system of claim 1, further comprising means for applying a liquid on the surfaces of the wafer to prevent surface damage by the scrubbers.

7. The double sided scrubber system of claim 1, wherein said scrubber axes converge when the scrubbers are in said operative positions.

8. The double sided scrubber system of claim 1 wherein at least a part of said frictional force difference is created by providing at least one of said scrubbers with a lower radial compressibility adjacent one end than adjacent the other end.

9. The double sided scrubber system of claim 1 wherein at least a part of said frictional force difference is created by providing at least one of said scrubbers with a first material in engagement with the wafer at the first end of such scrubber and a second material different from said first material at the second end of such scrubber.

10. The double sided scrubber system of claim 9 wherein said at least one of said scrubbers has a foam material covering one end of the scrubber and bristles at the other end of the scrubber.

11. The double sided scrubber system of claim 1, wherein said constraint structure comprises a movable support structure disposed on an indexing conveyor.

12. The double sided scrubber system of claim 1, wherein at least one of said scrubbers is tapered such that one end of such scrubber has a larger diameter than the other end of such scrubber.

13. The double sided scrubber system of claim 1, wherein at least one of said scrubbers is formed of a sponge material.

14. The double sided scrubber system of claim 1, wherein at least one of said scrubbers includes a layer of bristles.

15. The double sided scrubber system of claim 14, wherein said layer of bristles comprises bristles having varying degrees of stiffness.

16. The double sided scrubber system of claim 1, wherein when said scrubbers are brought into contact with the wafer surfaces said scrubbers contact the top and bottom surfaces of the wafer in regions of contact extending entirely across the wafer.

17. A method of cleaning a wafer having a top surface and a bottom surface comprising the steps of:
   a) engaging an upper scrubber and a lower scrubber of a first scrubber set with top and bottom surfaces of the wafer, each of said scrubbers having a first end, a second end and an axis extending between the first and second ends, said axes of said scrubbers extending across the top and bottom surfaces of the wafer so that first ends of the scrubbers are disposed on one side of the center of the wafer whereas second ends of the scrubbers are disposed on the other side of the center of the wafer, said scrubbers engaging the wafer with a first frictional force adjacent the first ends of the scrubbers and with a second frictional force different from said first frictional force adjacent the second ends of the scrubbers to thereby provide a frictional force difference; and
   b) driving the scrubbers in rotation about their respective axes in opposite rotational directions so that differences in frictional forces applied by said scrubbers to the wafer impel the wafer in rotation about a central axis transverse to the axes of the scrubbers and transverse to the top and bottom surfaces of the wafer.

18. The method of cleaning a wafer as claimed in claim 17 further including the step of providing a liquid on the surfaces of the wafer to prevent surface damage by the scrubbers.

19. The method of cleaning a wafer as claimed in claim 17 further including the step of moving a second scrubber set into engagement with the wafer surfaces after ceasing rotation of the first scrubber set.

20. The method of cleaning a wafer as claimed in claim 17, wherein said frictional force difference is created by engaging the scrubbers with said wafer so that the scrubbers axes converge at one end.

21. The method of cleaning a wafer as claimed in claim 17 wherein said frictional force difference is created by providing at least one of said scrubbers with a lower radial compressibility adjacent one end than adjacent the other end.

* * * * *